(12) United States Patent
Laird et al.

(10) Patent No.: US 7,226,528 B2
(45) Date of Patent: *Jun. 5, 2007

(54) METHODS OF MAKING COATED ARTICLES BY SPUTTERING SILVER IN OXYGEN INCLUSIVE ATMOSPHERE

(75) Inventors: Ronald E. Laird, Dexter, MI (US); George Neuman, Ann Arbor, MI (US); Philip J. Lingle, Temperance, MI (US); Jean-Marc Lemmer, Luxembourg (LU); Keith H. Schillinger, Farmington, NY (US)

(73) Assignees: Guardian Industries Corp., Auburn Hills, MI (US); Centre Luxembourgeois de Recherches pour le Verre et la Ceramique S.A. (C.R.V.C.), Grand Duche de Luxembourg ( * ) Notice: Subject to any disclaimer, the term of this patent is extended or adjusted under 35 U.S.C. 154(b) by 572 days.

This patent is subject to a terminal disclaimer.

(21) Appl. No.: 10/802,918

(22) Filed: Mar. 18, 2004

(65) Prior Publication Data

US 2004/0180214 A1 Sep. 16, 2004

Related U.S. Application Data

(62) Division of application No. 10/243,952, filed on Sep. 16, 2002, now Pat. No. 6,787,005.

(60) Provisional application No. 60/407,687, filed on Sep. 4, 2002.

(51) Int. Cl.
*C23C 14/34* (2006.01)

(52) U.S. Cl. .................. 204/192.27; 204/192.26; 204/192.22

(58) Field of Classification Search .......... 204/192.12, 204/192.15, 192.26, 192.27, 192.28, 192.22
See application file for complete search history.

(56) References Cited

U.S. PATENT DOCUMENTS

| | | | |
|---|---|---|---|
| 3,843,405 A | 10/1974 | Bourg | 117/217 |
| 4,413,877 A | 11/1983 | Suzuki et al. | 350/1.7 |
| 4,898,789 A | 2/1990 | Finley | 428/623 |
| 5,201,926 A | 4/1993 | Szczyrbowski et al. | 65/60.2 |
| 5,229,194 A | 7/1993 | Lingle et al. | 428/216 |
| 5,332,888 A | 7/1994 | Tausch et al. | 219/547 |
| 5,344,718 A | 9/1994 | Hartig et al. | 428/623 |
| 5,514,476 A | 5/1996 | Hartig et al. | 428/426 |
| 5,557,462 A | 9/1996 | Hartig et al. | 359/585 |
| 5,563,734 A | 10/1996 | Wolfe et al. | 359/360 |

(Continued)

FOREIGN PATENT DOCUMENTS

DE 195 33 053 4/1997

(Continued)

OTHER PUBLICATIONS

U.S. Appl. No. 10/243,952, filed Sep. 16, 2002.

(Continued)

*Primary Examiner*—Rodney G. McDonald
(74) *Attorney, Agent, or Firm*—Nixon & Vanderhye P.C.

(57) ABSTRACT

A sputter coated article is provided with improved mechanical durability (e.g., pre-HT scratch resistance) and/or thermal stability by sputtering at least one Ag inclusive layer in an atmosphere including at least $O_2$ gas. For instance, in certain example embodiments an Ag inclusive target may be sputtered in an atmosphere including a combination of Ar and $O_2$ gas. In certain embodiments, this enables the resulting $AgO_x$ infrared (IR) reflecting layer to better adhere to adjacent contact layer(s).

27 Claims, 6 Drawing Sheets

U.S. PATENT DOCUMENTS

| | | | | |
|---|---|---|---|---|
| 5,584,902 | A | 12/1996 | Hartig et al. | 65/32.4 |
| 5,770,321 | A | 6/1998 | Hartig et al. | 428/622 |
| 5,800,933 | A | 9/1998 | Hartig et al. | 428/622 |
| 5,834,103 | A | 11/1998 | Bond et al. | 428/216 |
| 5,942,338 | A | 8/1999 | Arbab et al. | 428/623 |
| 6,014,872 | A | 1/2000 | Hartig et al. | 65/58 |
| 6,524,688 | B1 | 2/2003 | Eby et al. | 428/216 |
| 6,576,349 | B2 | 6/2003 | Lingle et al. | 428/610 |
| 6,602,608 | B2 | 8/2003 | Stachowiak | 428/432 |
| 6,623,846 | B2 | 9/2003 | Laird | 428/216 |
| 6,787,005 | B2 * | 9/2004 | Laird et al. | 204/192.27 |
| 2001/0041252 | A1 | 11/2001 | Laird | 428/216 |
| 2002/0031674 | A1 | 3/2002 | Laird | 428/472 |
| 2002/0068167 | A1 | 6/2002 | Veerasamy | 428/341 |
| 2003/0049464 | A1 | 3/2003 | Glenn et al. | 428/432 |

FOREIGN PATENT DOCUMENTS

| | | |
|---|---|---|
| WO | WO 99/64362 | 12/1999 |
| WO | WO 01/66483 | 9/2001 |
| WO | WO 02/04375 | 1/2002 |

OTHER PUBLICATIONS

XP-002267135, "Method Manufacture Laminate Component Display Device Interposed Oxide Film Silver Group Material Substrate Silver System Film Contain Silver Group Material", Jun. 17, 2003.

International Search Report dated Jan. 29, 2004.

XP-001073840 "Preparation de Couches Minces DE $Ag_2O$ ET Action DE Certains Gaz Sur Celles-CI", Mitaray et al., Thin Solid Films, 46 (1977) pp. 201-208.

XP-00202187 "The Role of Neutral Oxygen Radicals in the Oxidation of Ag Films", Schmidt et al., Thin Solid Films 281-282 (1996), pp. 105-107.

"Adhesion of Silver Films to Ion-Bombarded Zirconia", ERCK, vol. 47, 8, pp. 640-644, no date.

"Ion Beam Mixing of Silver-Magnesium Oxide Multilayers", Fuchs et al., Thin Solid Films 165 (1988) pp. 347-358.

"Ion Assisted Deposition of Silver" Thin Films, Lee et al., Thin Solid Films 359 (2000) pp. 95-97.

"Swift Heavy Ion-Induced Modification of Metallic" Thin Films and Multilayers, GUPTA, Vacuum 58 (2000) pp. 16-32.

"Roughness Modification of Surfaces Treated by a Pulsed Dielectric Barrier Discharge", Dumitrascu et al., Apr. 5, 2002, pp. 127-134.

"MeV Heavy Ion-Induced Adhesion of Thin Silver Film to Tantalum", Qiu et al., 1991, pp. 367-372.

PROCEEDINGS Coating Technology Symposium, Maui, Feb. 3-6, 1987 Airco, Ross et al.

US 4,960,645, 10/1990, Lingle et al. (withdrawn)

* cited by examiner

METHODS OF MAKING COATED ARTICLES BY SPUTTERING SILVER IN OXYGEN INCLUSIVE ATMOSPHERE

This application is a divisional of U.S. patent application Ser. No. 10/243,952, filed Sep. 16, 2002 now U.S. Pat. No. 6,787,005, which claims the benefit of Provisional Application No. 60/407,687, filed Sep. 4, 2002, the entire contents of which are hereby incorporated herein by reference.

This invention relates to heat treatable low emissivity (low-E) coated articles, and methods of making the same. Such coated articles may be used in the context of vehicle windshields, insulating glass (IG) units, other types of architectural and/or vehicle windows, and other suitable applications.

BACKGROUND AND SUMMARY OF THE INVENTION

Layer coatings provided for solar management purposes are known in the art. Such coatings often seek to reflect significant amounts of infrared (IR) radiation while at the same time enabling a high amount of visible light transmittance. High visible transmittance is often desired, and this need often conflicts with the need for good IR reflection, and it is difficult to obtain both simultaneously. It is also desirable for such coatings to be heat treatable in some instances, so that they may be used in vehicle windows where heat bending is required, tempered architectural or vehicle windows, and/or the like.

WO 02/04375 discloses a low-E coating including the following layers: glass/$TiO_x$/$Si_xN_y$/$NiCrO_x$/Ag/$NiCrO_x$/$SnO_x$/$Si_xN_y$/$NiCrO_x$/Ag/$NiCrO_x$/$SnO_x$/$Si_xN_y$. The metallic Ag layers are sputtered in an argon (Ar) gas atmosphere, as is typical in the art. This low-E coating provides for excellent solar performance and is an overall good coating. However, it has been found that this coating is subject to scratching during, for example, pre-final-product processing (e.g., before heat treatment).

In view of the above, it will be apparent to those skilled in the art that there exists a need in the art for a low-E coating that is more mechanically durable and thus less susceptible to scratching and the like, and/or which is more thermally stable (i.e., does not suffer a radical drop in visible transmission upon heat treatment such as tempering).

An object of certain example embodiments of this invention is to provide a more durable coating that is less susceptible to scratching and/or other types of mechanical damage, and/or which has improved thermal stability.

Surprisingly, it has been found that sputtering the Ag inclusive layers of the aforesaid coating in an atmosphere not simply including Ar gas, but also including oxygen gas ($O_2$), renders the resulting coating (a) more mechanically durable and less susceptible to scratching, and/or (b) acceptably thermally stable. For example, it has been found that sputtering at least one of the Ag inclusive layers of the aforesaid coating in an atmosphere including a combination of Ar/$O_2$ gas leads to a more durable without sacrificing thermal stability.

U.S. Pat. No. 5,584,902 discloses a low-E coating system including, from the glass substrate outward, a stack of: $Si_3N_4$/NiCr/Ag/NiCr/$Si_3N_4$. Like most other prior art, the Ag layer of the '902 patent is preferably sputtered in an Ar gas atmosphere (e.g., see col. 16, lines 33-45). However, the '902 patent does mention at col. 12, lines 59-63, that each of the three metallic layers NiCr/Ag/NiCr may be sputtered optionally in an atmosphere including "a small amount of $O_2$ (e.g. about 5-10%)." However, this means that all three layers (NiCr, Ag and NiCr) are sputtered in the same atmosphere, and that each atmosphere includes the same amount of oxygen—this is undesirable in many instances. While the '902 coating is heat treatable and low-E in nature, it is characterized by rather high emissivity and/or sheet resistance values which lead to rather low $R_{solar}$ (total solar energy reflectance) values around 22-24%. For example, one coating reported in the '902 patent had a sheet resistance ($R_s$) of 14.4 ohms/square and a normal emissivity ($E_n$) of 0.15 before heat treatment; and a $R_s$ of 10.5 ohms/square and a $E_n$ of 0.11 after heat treatment. Moreover, there is no disclosure or suggestion in the '902 patent that sputtering an Ag target in an atmosphere including oxygen can lead to improved mechanical durability and/or thermal stability.

As explained above, an object of certain embodiments of this invention is to provide a more durable low-E coating that is less susceptible to scratching and/or other types of mechanical damage, and/or which has improved thermal stability. This object may be fulfilled by sputtering at least one Ag inclusive layer in an atmosphere including $O_2$ gas (e.g., a combination of Ar and $O_2$ gas may be used). The use of oxygen gas proximate the Ag sputtering target is especially beneficial in this respect when one or more of the immediately adjacent contact layers is/are significantly oxidized (e.g., when one or both of the adjacent contact layers comprises $NiCrO_x$).

Another object of certain exemplary embodiments of this invention is to provide a dual silver low-E coating which is heat treatable and is mechanically and/or chemically durable.

Another object of certain exemplary embodiments of this invention is to provide a heat treatable low-E coating having high visible transmittance (e.g., of at least about 65%) combined with a normal emissivity ($E_n$) of no greater than 0.08 (more preferably no greater than 0.06) before heat treatment, and/or an $E_n$ of no greater than 0.07 (more preferably no greater than 0.05) after heat treatment (HT).

Another object of certain exemplary embodiments of this invention is to provide a heat treatable low-E coating having high visible transmittance combined with a sheet resistance ($R_s$) of no greater than 10.0 ohms/sq. (more preferably no greater than 8.0 ohms/sq., and most preferably no greater than about 5.0 ohms/sq.) before heat treatment; and/or a $R_s$ of no greater than 8.0 ohms/sq. (more preferably no greater than 6.0 ohms/sq., and most preferably no greater than about 4.0 ohms/sq.) after heat treatment.

Another object of this invention is to fulfill one or more of the above-listed objects.

Generally speaking, certain example embodiments of this invention fulfill one or more of the above-listed objects by providing a method of making a coated article including a coating supported by a glass substrate, the method comprising: sputtering a first dielectric layer so as to be supported by the glass substrate; sputtering a first contact layer on the substrate over the first dielectric layer; sputtering a target comprising Ag in an atmosphere including at least oxygen gas in order to form an infrared (IR) reflecting layer comprising $AgO_x$ which is located over and contacts the first contact layer; sputtering a second contact layer on the substrate so that the second contact layer is located over and in contact with the IR reflecting layer comprising $AgO_x$; and wherein said sputtering of at least one of the contact layers comprises sputtering a target comprising a metal or metal alloy in an atmosphere including at least oxygen gas in order to form a metal oxide contact layer, and wherein more oxygen gas is introduced into an atmosphere used in sputtering the metal oxide contact layer than is introduced into an atmosphere proximate the target comprising Ag used in sputtering the IR reflecting layer comprising $AgO_x$. In one example embodiment, oxygen may be fed into the neighboring cathode bay instead of directly into either the contact layer or IR reflecting layer bays; oxygen would thereby enter into the contact layer and/or IR reflecting layer bay(s)s by diffusion.

Certain other example embodiments of this invention fulfill one or more of the above-listed objects by providing a coated article including a coating supported by a glass substrate, the coating comprising: a first dielectric layer supported by the glass substrate; a first contact layer comprising a metal oxide provided on the substrate over the first dielectric layer, wherein a central portion of the first contact layer is at least about 40% oxidized; an IR reflecting layer comprising $AgO_x$ contacting the first contact layer, wherein the first contact layer is either above or below the IR reflecting layer on the substrate; and at least one dielectric layer provided on the substrate over the IR reflecting layer and the first contact layer.

Certain other example embodiments of this invention fulfill one or more of the above-listed objects by providing a coated article including a coating supported by a glass substrate, the coating comprising: a first dielectric layer supported by the glass substrate; an optional first contact layer comprising a metal oxide provided on the substrate over the first dielectric layer, wherein a portion of the first contact layer is at least about 40% oxidized; an IR reflecting layer comprising $AgO_x$ contacting the first contact layer or the bottom dielectric layer, an optional contact layer above the IR reflecting layer; and at least one dielectric layer provided on the substrate over the IR reflecting layer contacting directly either the IR reflecting layer or the optional contact layer.

This invention will now be described with respect to certain example embodiments thereof as illustrated in the following drawings, wherein:

IN THE DRAWINGS

FIG. 3(*b*) is cross sectional view of a portion of a coating according to another optional embodiment of this invention illustrating an IR reflecting layer surrounded by a pair of contact layers (e.g., $NiCrO_x$ layers), only one of which is oxidation graded.

DETAILED DESCRIPTION OF CERTAIN EXEMPLE EMBODIMENTS OF THE INVENTION

Figure 1:
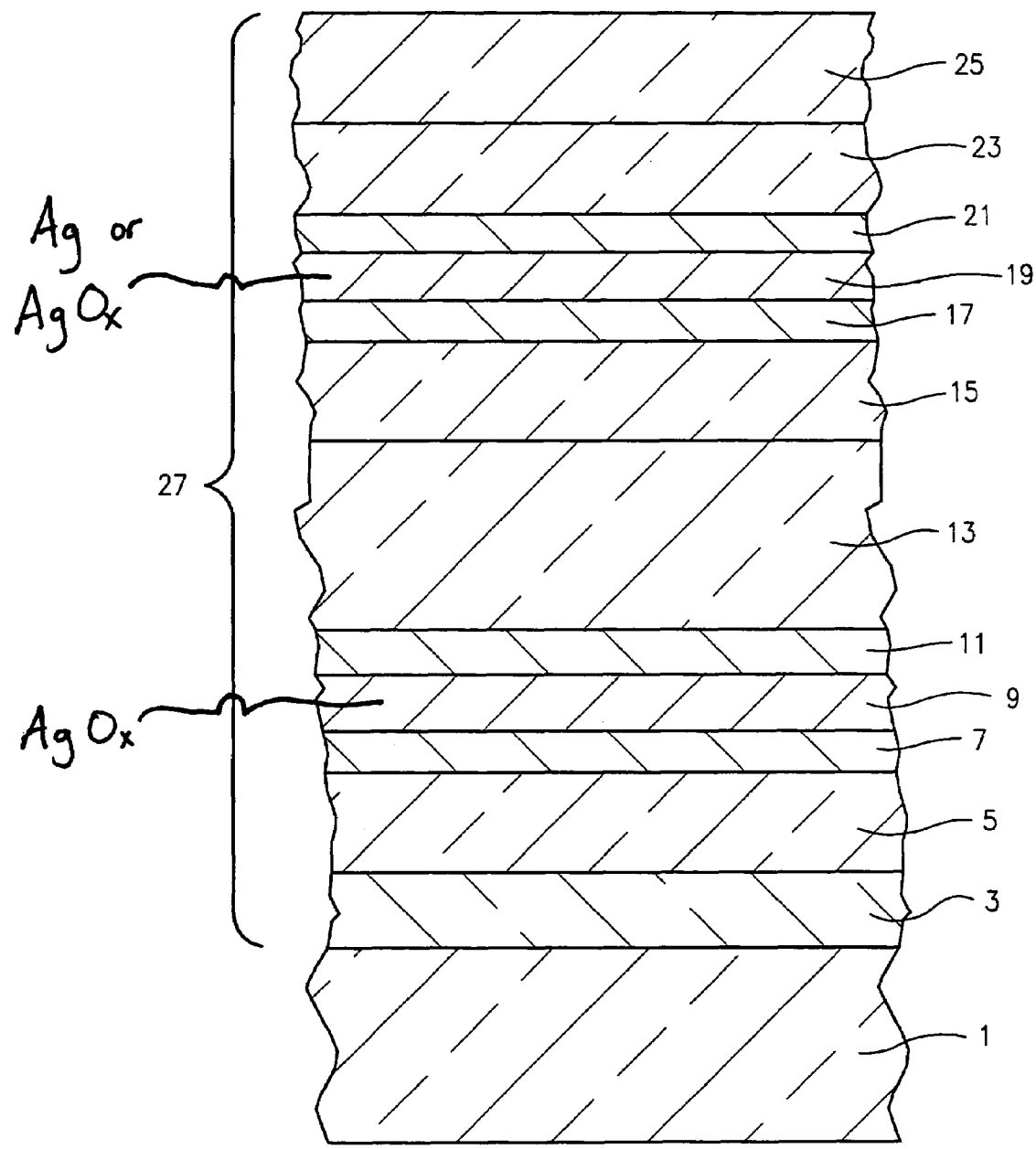
FIG. 1 is a side cross sectional view of a coated article according to an example embodiment of this invention.

Referring now more particularly to the accompanying drawings in which like reference numerals indicate like parts or layers throughout the several views.

Certain embodiments of this invention provide a low-E coating or layer system that may be used in applications such as vehicle windshields, other vehicle windows, skylights, glass doors, IG units, other types of architectural or residential windows, and the like. Coatings according to certain embodiments of this invention preferably have low-E characteristics as well as high visible transmittance, and are heat treatable. Preferably, coatings of certain embodiments herein are mechanically durable before and/or after heat treatment (HT), and HT does not cause a significant jump in sheet resistance ($R_s$) and/or haze. As is known in the art, such HT often necessitates heating the coated substrate to temperature(s) of from 560° C. to 800° C. for a sufficient period of time to attain the desired result (e.g., tempering, bending, and/or heat strengthening).

Improved mechanical durability (e.g., pre-HT) is surprisingly achieved according to certain embodiments of this invention by sputtering at least one Ag inclusive layer (9 and/or 19) in an atmosphere including at least $O_2$ gas. For instance, in certain example embodiments an Ag inclusive target may be sputtered in an atmosphere including a combination of Ar (or other inert) and $O_2$ gas. The result is a layer of or including $AgO_x$. The term "$AgO_x$" as used herein means that the layer (9 and/or 19) including Ag is formed when at least some oxygen is present in a sputtering chamber in which an Ag inclusive target is located so that the resulting layer is (a) at least partially oxidized, and/or (b) of or includes metallic Ag intermixed with oxygen atoms. It has surprisingly been found that the use of the oxygen in the Ag sputtering chamber improves the adhesion between the $AgO_x$ layer (9 and/or 19) and at least one of the immediately adjacent contact layers (7, 11, 17 and/or 21) (e.g., a contact layer may be of or include $NiCrO_x$, or any other suitable material, so long as it contacts the layer including Ag). This benefit of using oxygen in the Ag sputtering chamber has been found to be particularly advantageous when the contact layer(s) (7, 11, 17 and/or 21) is significantly oxidized; i.e., the central portion of the contact layer(s) is at least partially oxidized, and at least some part of the contact layer is at least about 40% oxidized, more preferably at least about 50% oxidized, and most preferably at least about 60% oxidized. In certain embodiments, visible transmission of the coated article does not decrease upon heat treatment for thermal tempering or the like. In certain embodiments, transmission starts low (e.g., at 60-65%, such as 63%) and then increases upon heating from about 1-10%.

FIG. 1 is a side cross sectional view of a coated article according to an embodiment of this invention. The coated article includes substrate 1 (e.g., clear, green, bronze, or blue-green glass substrate from about 1.0 to 10.0 mm thick, more preferably from about 1.8 mm to 4 mm thick), first dielectric anti-reflection layer 3, second dielectric layer 5, first lower contact layer 7 (which contacts layer 9), first $AgO_x$ conductive infrared (IR) reflecting layer 9, first upper contact layer 11 (which contacts $AgO_x$ layer 9), third dielectric layer 13 (which may be deposited in one or multiple steps in different embodiments of this invention), fourth dielectric layer 15, second lower contact layer 17 (which contacts layer 19), second $AgO_x$ or Ag conductive IR reflecting layer 19, second upper contact layer 21 (which contacts layer 19), fifth dielectric layer 23, and finally sixth protective dielectric layer 25. The "contact" layers each contact at least one IR reflecting layer 9 or 19. The aforesaid layers 3-25 make up heat treatable low-E (i.e., low emissivity) coating 27 which is provided on glass or plastic substrate 1.

In certain embodiments of this invention, first dielectric layer 3 may be of or include titanium dioxide ($TiO_x$ where x is from 1.7 to 2.3, most preferably 2.0), silicon nitride ($Si_xN_y$, where x/y may be about 0.75 (i.e., $Si_3N_4$), or alternatively x/y may be from about 0.76 to 1.5 in Si-rich embodiments), silicon dioxide ($SiO_x$ where x is from 1.7 to 2.3, most preferably about 2.0), niobium oxide (e.g., $Nb_2O_5$), SiZrN, tin oxide, zinc oxide, silicon oxynitride, or any other suitable dielectric material. First dielectric layer 3 functions as an antireflection layer in certain embodiments of this invention.

Second dielectric layer 5 may function to reduce haze in certain embodiments of this invention, and is preferably of or includes silicon nitride (e.g., $Si_3N_4$, or alternatively silicon-rich silicon nitride $Si_xN_y$, where x/y is from 0.76 to 1.5, more preferably from 0.85 to 1.2, for haze reduction purposes). When sputtering silicon nitride layer(s) herein, a Si target may be used, or alternative a target including Si admixed with up to 3-20% by weight aluminum and/or stainless steel (e.g. SS#316) may be used, with about this amount of aluminum and/or steel then appearing in the layer(s) so formed. Other materials may also be used for haze reducing layer 5, including but not limited to SiZrN.

Infrared (IR) reflecting layers 9 and 19 preferably include silver (Ag) as an IR reflecting material. One or both of IR reflecting layers 9, 19 may be of or include $AgO_x$ as described above (e.g., formed by sputtering Ag target in an oxygen inclusive atmosphere). When only one of layers 9 and 19 is of or includes $AgO_x$, the other IR reflecting layer may be of or include Ag or any other suitable IR reflecting material. These IR reflecting layers 9, 19 help enable coating 27 to have low-E characteristics.

Contact layers 7, 11, 17, and 21 are of or include nickel (Ni) oxide, or a nickel alloy oxide such as nickel chrome oxide ($NiCrO_x$), in certain embodiments of this invention. $NiCrO_x$ layers 7, 11, 17, and/or 21 may be fully oxidized in certain embodiments of this invention (i.e., fully stochiometric), or may be at least about 75% oxidized in other embodiments of this invention. While $NiCrO_x$ is a preferred material for layers 7, 11, 17 and/or 21, those skilled in the art will recognized that other materials may instead be used and that one or more of the contact layers may be a metal oxide such as oxides of Ni, oxides of Ni alloys, oxides of Cr, oxides of Cr alloys. $NiCrO_xN_y$, or any other suitable material. Thus, when it is said that a contact layer is a "metal oxide", this includes oxides of metal alloys such as NiCr and also includes layers that may be partially nitrided in addition to oxided. Optionally, one or both contact layers may be removed adjacent one or both IR reflecting layers.

In any event, regardless of what metal(s) is provided in contact layer(s) 7, 11, 17 and 21, the benefit of using oxygen in an Ag sputtering chamber(s) has been found to be particularly advantageous when one or more of the contact layer(s) (7, 11, 17 and/or 21) located adjacent an $AgO_x$ layer (9 or 19) is significantly oxidized. Thus, at least one contact layer (and preferably two) located adjacent an $AgO_x$ layer has a central portion that is at least partially oxidized, and at least some part of the contact layer is at least about 40% oxidized, more preferably at least about 50% oxidized, and most preferably at least about 60% oxidized. It is noted that contact layers 7, 11, 17 and/or 21 may or may not be continuous in different embodiments of this invention.

When layers 7, 11, 17 and/or 21 comprise $NiCrO_x$ in certain embodiments, the Ni and Cr may be provided in different amounts, such as in the form of nichrome by weight about 0-90% Ni and 10-90% Cr. An exemplary sputtering target for depositing these layers includes not only SS-316 which consists essentially of 10% Ni and 90% other ingredients, mainly Fe and Cr, but Haynes 214 alloy as well.

One or more of contact layers 7, 11, 17, and/or 21 (e.g., of or including $NiCrO_x$) may be oxidation graded in certain embodiments of this invention so that the degree of oxidation in the layer(s) changes throughout the thickness of the layer(s). Oxidation grading is optional, and need not be provided in certain embodiments of this invention. When oxidation grading is practiced, one or more of contact layers (7, 11, 17 and/or 21) may be graded so as to be less oxidized at the contact interface with the immediately adjacent IR reflecting layer (9 or 19) than at a portion of the contact layer(s) further or more/most distant from the immediately adjacent IR reflecting layer (a central portion of the contact layer is at least partially oxidized in any event). It is believed that oxidation grading of one or more of contact layer(s) 7, 11, 17 and/or 21 may help the low-E coating 27 to achieve the combination of heat treatability and high visible transmission.

Figure 3A:
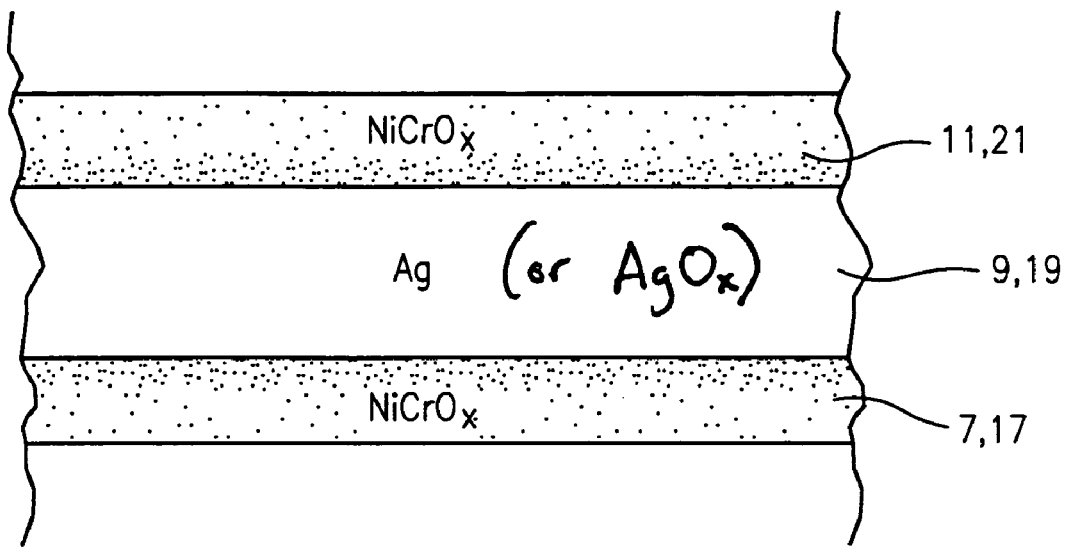
FIG. 3(*a*) is cross sectional view of a portion of a coating according to an optional embodiment of this invention illustrating a pair of oxidation graded contact layers (e.g., $NiCrO_x$ layers) surrounding an IR reflecting layer.
Figure 3B:
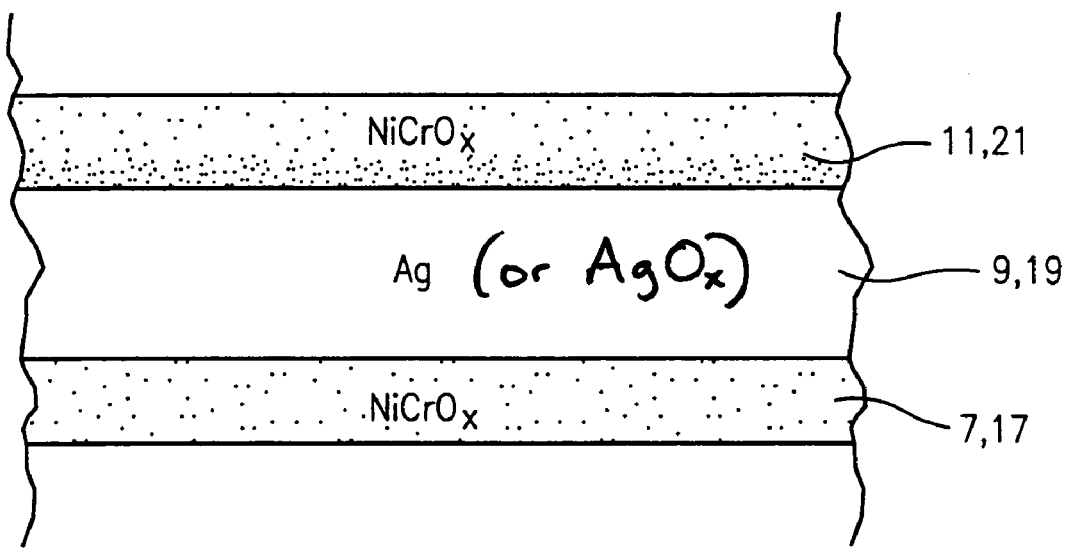

FIGS. 3(a) and 3(b) illustrate various types of oxidation grading of the contact layer(s) according to certain example embodiments of this invention. These figures are for purposes of example only. Further details with respect to oxidation grading of the contact layer(s) may be found in U.S. Ser. No. 09/794,224, filed Feb. 28, 2001 (now U.S. Pat. No. 6,576,349), the entire disclosure of which is hereby incorporated herein by reference.

Figure 4:
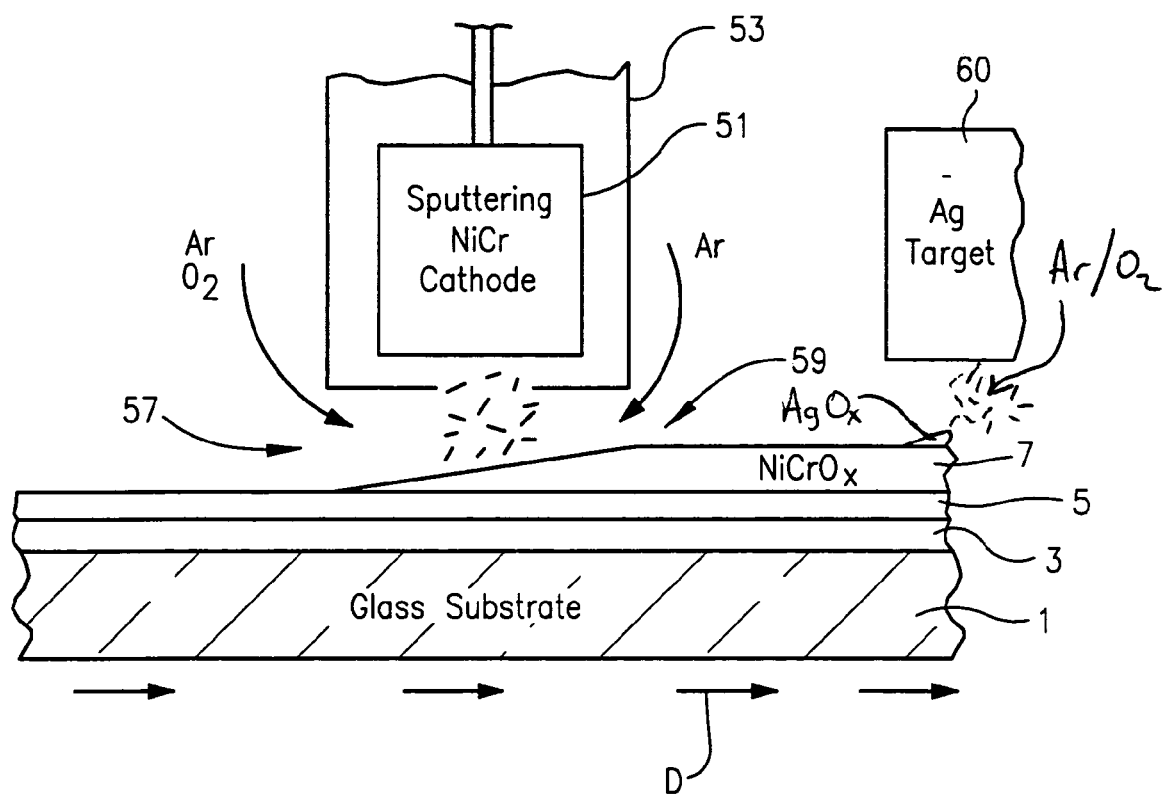
FIG. 4 is a schematic and partial cross sectional view illustrating how an optional graded contact layer (e.g., $NiCrO_x$ layer) is deposited via sputtering in accordance with an example embodiment of this invention.

FIG. 4 illustrates how an oxidation graded contact layer may be deposited on a substrate as part of a coating according to an exemplary embodiment of this invention, using an asymmetric introduction of oxygen gas at a target area. Substrate 1 with part of a layer system thereon proceeds in direction D through the sputter coater. When the substrate 1 is moving in direction D beneath target 51 (within shield 53), gas is introduced around the target on two sides 57 and 59 thereof. On one side 57 of target 51, at least oxygen (e.g., $O_2$) gas (e.g., oxygen flow of about 30-60 mL/min. at 4.1 kW), and optionally a mixture of oxygen and an inert gas such as argon (Ar), is fed into the coating zone beneath and/or proximate the target. However, on the other side 59 of target 51, less oxygen gas is used and more of another gas such as Ar is introduced into the coating zone beneath and/or proximate the target. Again, further details with respect to oxidation grading may be found in U.S. Ser. No. 09/794,224 (now U.S. Pat. No. 6,576,349). It can also be seen that oxygen gas is used proximate the silver target 60 as discussed herein.

Turning back to FIG. 1, third dielectric layer 13 acts as a coupling layer between the two halves of the coating 27, and is of or includes tin oxide in certain embodiments of this invention. However, other dielectric materials may instead be used for layer 13, including but not limited to silicon nitride, titanium dioxide, niobium oxide, silicon oxynitride, zinc oxide, or the like. Fourth dielectric layer 15 functions as a haze reducer in certain embodiments of this invention, and is preferably of or includes silicon nitride (e.g., $Si_3N_4$, or alternatively silicon-rich silicon nitride discussed above). However, in alternative embodiments of this invention, other materials (e.g., SiZrN) may instead be used for dielectric layer 15.

Fifth dielectric layer 23 may be of or include tin oxide in certain embodiments of this invention. However, other dielectric materials may instead be used for layer 23, including but not limited to silicon nitride, titanium dioxide, niobium oxide, silicon oxynitride, zinc oxide, or the like. Protective overcoat dielectric layer 25 is provided at least for durability purposes, and may be of or include silicon nitride (e.g., $Si_3N_4$) in certain embodiments of this invention. However, other dielectric materials may instead be used for layer 25, including but not limited to titanium dioxide, silicon oxynitride, tin oxide, zinc oxide, niobium oxide, SiZrN, or the like.

Other layer(s) below or above the illustrated coating 27 may also be provided. Thus, while the layer system or coating 27 is "on" or "supported by" substrate 1 (directly or indirectly), other layer(s) may be provided therebetween. Thus, for example, coating 27 of FIG. 1 may be considered "on" and "supported by" the substrate 1 even if other layer(s) are provided between layer 3 and substrate 1. Moreover, certain layers of coating 27 may be removed in certain embodiments, while others may be added in other embodiments of this invention without departing from the overall spirit of certain embodiments of this invention.

Further details regarding the aforesaid layers 3-7, 11-17 and 21-25 may be found in U.S. Ser. No. 09/794,224, filed Feb. 28, 2001 (now U.S. Pat. No. 6,576,349), the entire disclosure of which is hereby incorporated herein by reference (see also WO 02/04375).

Figure 2:
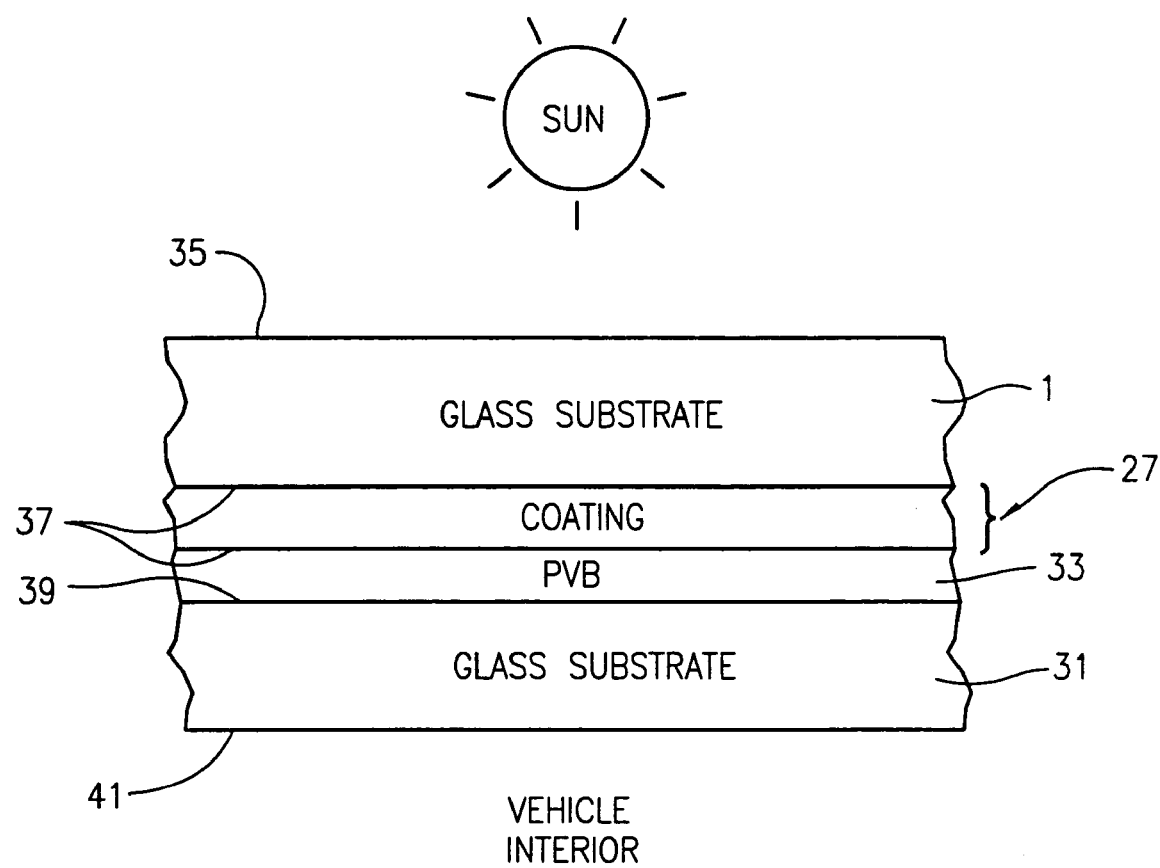
FIG. 2 is a schematic partial cross sectional view of a laminated vehicle windshield according to an example embodiment of this invention, in which coatings according to any embodiment of this invention may be used.

FIG. 2 illustrates a laminate (e.g., vehicle windshield) according to an embodiment of this invention, including coating 27 of FIG. 1. As shown in FIG. 2, the laminate (e.g., windshield) includes first glass substrate 1 on which coating 27 is provided, and second glass substrate 31. PVB (or other polymer inclusive material) layer 33 is provided between the substrates in a known manner, so as to contact coating 27 on one side thereof. In the FIG. 2 embodiment, coating 27 is provided at/on the second (or #2) surface 37 of the laminate. The first surface 35 is at the exterior of the laminate exposed to the outside of the vehicle, second surface 37 is on the interior or inside of outer substrate 1, third surface 39 is on the inside of the interior substrate 31, and fourth surface 41 is at the interior of the vehicle. Coatings 27 herein are preferably provided on either the second 37 or third 39 surface(s) of such laminates (the same is also true with regard to IG units).

Turning back to FIG. 1, while various thicknesses may be used consistent with one or more of the objects discussed herein, exemplary preferred thicknesses and example materials for the respective layers on the glass substrate 1 in the FIG. 1 embodiment are as follows:

TABLE 1

(Example Materials/Thicknesses; FIG. 1 Embodiment)

| Layer | Preferred Range (Å) | More Preferred (Å) | Example |
|---|---|---|---|
| $TiO_x$ (layer 3) | 0–400 Å | 40–200 Å | 80 Å |
| $Si_xN_y$ (layer 5) | 0–400 Å | 50–250 Å | 165 Å |
| $NiCrO_x$ (layer 7) | 5–100 Å | 10–50 Å | 26 Å |
| $AgO_x$ (layer 9) | 50–250 Å | 80–120 Å | 103 Å |
| $NiCrO_x$ (layer 11) | 5–100 Å | 10–50 Å | 26 Å |
| $SnO_2$ (layer 13) | 0–800 Å | 450–800 Å | 550 Å |
| $Si_xN_y$ (layer 15) | 0–800 Å | 50–250 Å | 165 Å |
| $NiCrO_x$ (layer 17) | 5–100 Å | 10–50 Å | 26 Å |
| Ag (layer 19) | 50–250 Å | 80–150 Å | 130 Å |
| $NiCrO_x$ (layer 21) | 5–100 Å | 10–50 Å | 26 Å |
| $SnO_2$ (layer 23) | 0–500 Å | 50–250 Å | 100 Å |
| $Si_3N_4$ (layer 25) | 0–500 Å | 100–300 Å | 205 Å |

Figure 6:
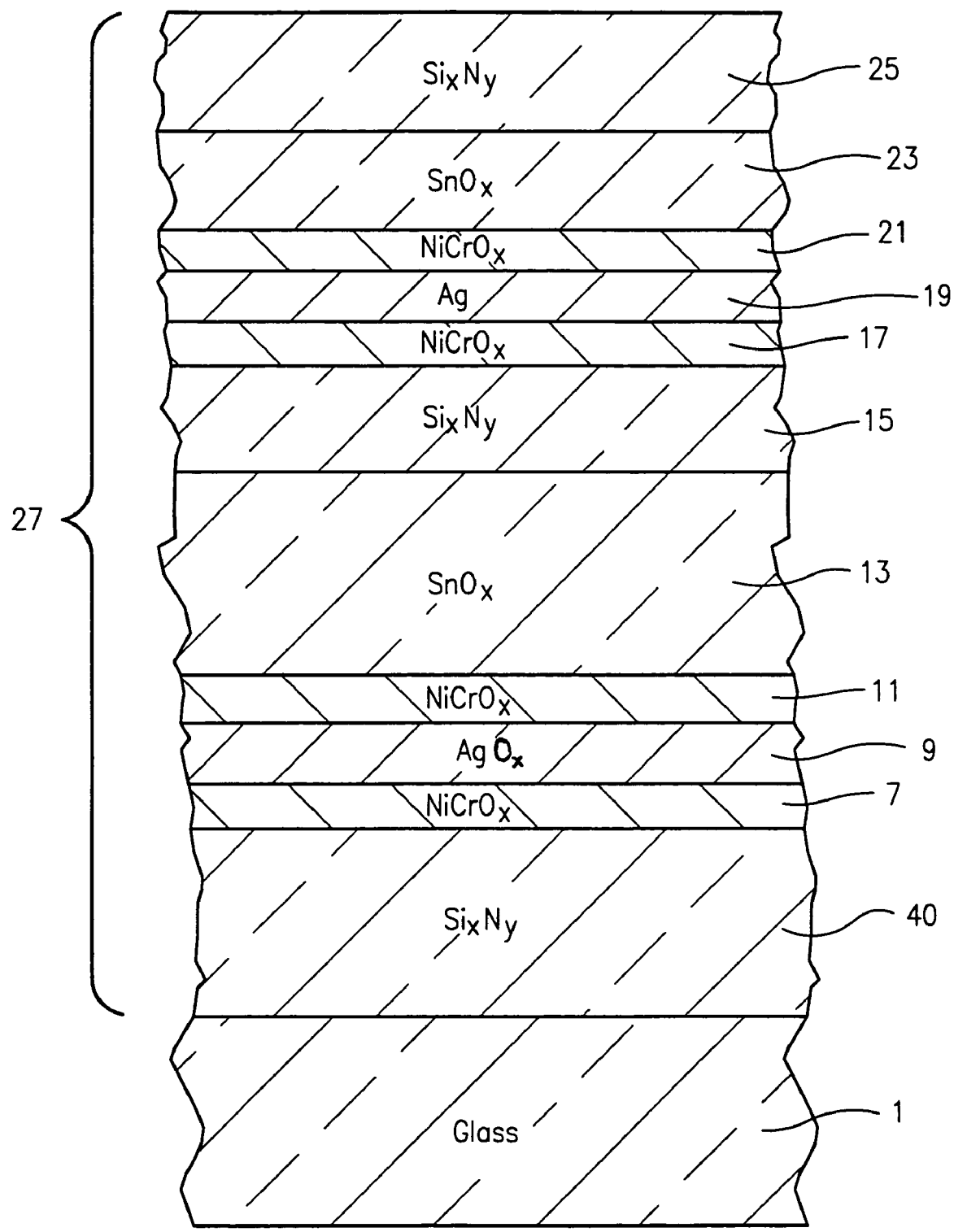
FIG. 6 is a cross sectional view of a coated article according to another embodiment of this invention.

FIG. 6 illustrates a low-E heat treatable coating 27 according to another embodiment of this invention. The FIG. 6 coating 27 is the same as the FIG. 1 coating described above, except that either (i) dielectric layer 3 is removed, or (ii) layers 3 and 5 are replaced with a single silicon nitride layer 40. Silicon nitride layer 40 may be of or include $Si_3N_4$ in certain embodiments of this invention. In other embodiments, silicon nitride layer 40 may be of or include $Si_xN_y$, where x/y may be from about 0.65 to 0.80, or alternatively from about 0.76 to 1.5 in silicon rich embodiments. In another embodiment of the particular FIG. 6 embodiment, layer 40 may be of or include SiZrN. Nitride layer 40 is advantageous because if functions to reduce haze, and is preferably from about 10 to 500 Å thick, more preferably from about 200-400 Å thick. As with all embodiments herein, Si-rich silicon nitride has improved performance in reducing haze compared to $Si_3N_4$.

In certain exemplary embodiments of this invention, coating/layer systems 27 have the following low-E characteristics before/after heat treatment (HT) when in monolithic form, as set forth in Table 2:

TABLE 2

Monolithic Before/After Heat Treatment (HT)

| Characteristic | General | More Preferred | Most Preferred |
|---|---|---|---|
| $R_s$ (ohms/sq.)(before HT): | <=10.0 | <=8.0 | <=5.0 |
| $R_s$ (ohms/sq.)(after HT): | <=8.0 | <=6.0 | <=4.0 |
| $E_n$ (before HT): | <=0.08 | <=0.06 | n/a |
| $E_n$ (after HT): | <=0.07 | <=0.05 | n/a |
| $T_{vis}$ (pre and post-HT): | >=60% | >=70% | >=75% |
| Haze (after HT): | <=0.40 | <=0.30 | <=0.28 |

As can be seen above, in certain embodiments of this invention where coated articles are used monolithically, they have a high visible transmittance both before and after HT.

Coatings 27 according to certain exemplary embodiments of this invention (e.g, FIGS. 1-6) have the following color/transmission/reflection/haze characteristics when on a clear soda lime silica glass substrate (e.g., 2-4 mm thick) in laminated or IG unit form with another similar clear soda lime silica glass substrate (e.g., in laminated form of a vehicle windshield with PVB or index oil between the two substrates as shown in FIG. 2, or in conventional IG unit form) as set forth in Table 3. In Table 3 below, $R_gY$ is visible reflection from the exterior of the vehicle/building as shown in FIG. 2, and $R_fY$ is visible reflection from the other side of the laminate such as from the vehicle/building interior in FIG. 2, and the a*, b* values under these respective reflection parameters also correspond to glass (g) side and film (f) side, respectively.

TABLE 3

Color/Transmission After HT; Laminated or IG Unit Form

| Characteristic | General | More Preferred |
|---|---|---|
| $T_{vis}$ (Ill. A, 2 deg.): | >=60% | >=70% |
| $T_{vis}$ (Ill. C, 2 deg.): | >=60% | >=70% |
| $R_gY$ (Ill. A, C; 2 deg.): | <=13% | <=11% |
| $a^*_g$ (Ill. C; 2°): | −3.0 to +5.0 | −2.0 to +2.0 |
| $b^*_g$ (Ill. C; 2°): | −10.0 to +10.0 | −8.0 to −2.0 |
| $R_fY$ (Ill. A, C; 2 deg.): | <=14% | <=12% |
| $a^*_f$ (Ill. C; 2°): | −5.0 to +5.0 | −2.0 to 2.0 |
| $b^*_f$ (Ill. C; 2°): | −10.0 to 10.0 | −5.0 to 5.0 |
| $R_{solar}$: | >=26% | >=28% |
| Haze: | <=0.4 | <=0.3 |
| $T_{solar}$: | <=50% | <=48% |
| $T_{ultraviolet}$: | <=0.45 | <=0.36 |
| SHGC: | <=0.50 | <=0.40 |

EXAMPLE

Figure 5:
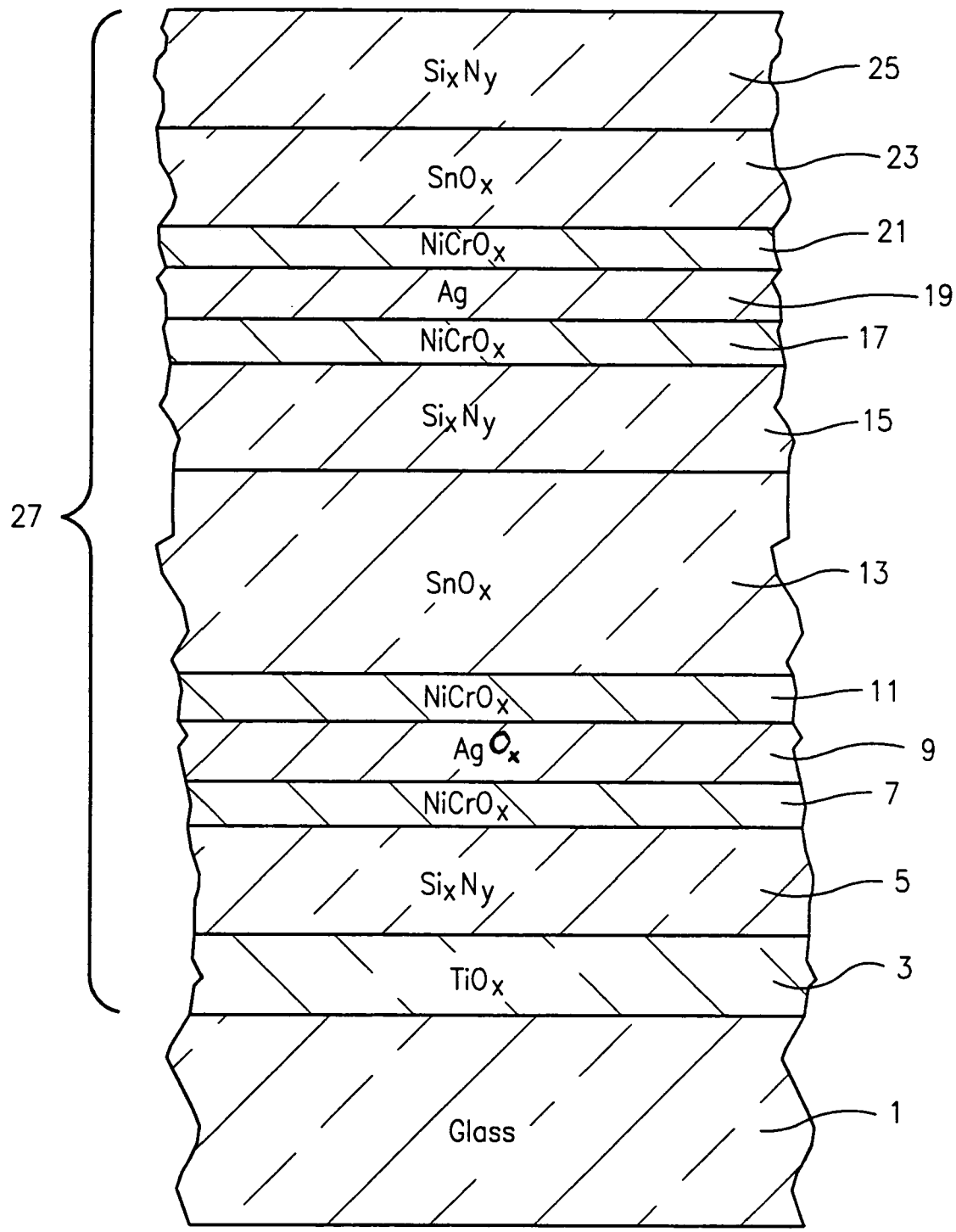
FIG. 5 is a cross sectional view of the layer stack of a coating according to an Example of the instant invention.

The following coating was made in accordance with an example embodiment of this invention (e.g., see FIG. 5); this example being provided for purposes of example but without limitation. The coating/layer system 27 shown in FIG. 5 is considered on a clear 3.3 mm thick large soda lime silica float glass substrate 1. A Leybold Terra-G seven-chamber sputter coating apparatus was used to sputter the coatings 27 onto the substrates 1. There was a total of 27 cathodes used. Cathode numbering utilizes the first digit to refer to the coater chamber, and the second digit to refer to the cathode position in that chamber. For example, cathode # 32 was the second cathode (second digit) in the third (first digit) sputter chamber. Thus, it can be seen for example that the cathodes used for sputtering the Ag inclusive layers (i.e., cathodes 31, 32 and 62, 63) are in different sputtering chambers than the cathodes used for sputtering the $NiCrO_x$ contact layers (i.e., cathodes 25, 33, 61 and 64). Below, "*" means Al content of approximately 10%. The line speed was about 4.99 meters per minute, and the coater/process setup is set forth in Table 4. All gas flows (e.g., oxygen, argon, nitrogen) are presented in units of sccm. Volts refers to cathode volts, and amps (A) refers to cathode amps. Pressure is measured in hecta pascals. Trim gas refers to individually adjusted gas flows along the cathode length to make corrections regarding layer thickness or stoichiometry uniformity, and the flow units are in terms of sccm. The NiCr targets were approximately 80/20 NiCr. The pressure for each sputter chamber was from 3.7 to 7 E-3 hPa.

embodiments of this invention, both layers 9, 19 (or alternatively just upper IR reflecting layer 19) may be of or include $AgO_x$. The coating from the Example above was characterized by solar/optical/thickness characteristics as set forth in Tables 1-3 above.

With respect to the lower IR reflecting layer 9 where both oxygen and argon gas is used in sputtering the Ag target, it can be seen that more oxygen gas may be introduced into the respective atmospheres proximate the targets used in sputtering the first and second contact layers (7, 11) (or in an intermediate unused bay/chamber) than is introduced into the atmosphere proximate the target comprising Ag used in sputtering the IR reflecting layer comprising $AgO_x$(9). In the Example above, 30 sccm of oxygen gas is introduced into the atmosphere proximate one of the Ag targets, while 193 sccm and 72 sccm of oxygen are introduced into the respective atmospheres used for sputtering the adjacent metal oxide contact layers 7 and 11, respectively. Thus, the respective contact layers 7 and 11 may be oxidized to a greater extent than is IR reflecting layer 9. The relative oxidation of a layer is complex function of the sputtering process parameters. We could therefore have situations where the relative oxidation of the contact layers versus the adjacent IR reflecting layer may not be directly correlated to the relative oxygen gas flows in the respective bays. The scope of the invention is not limited to the relative oxidation levels between the contact (or dielectric) layers and the IR reflecting layers, unless recited in the claims.

In certain embodiments of this invention, the ratio of (a) oxygen gas introduced into the atmosphere proximate the Ag

TABLE 4

Coater Setup/Processes for Example

| Cathode | Target | Volts (V) | Power (kW) | Ar (sccm) | $O_2$ (sccm) | $N_2$ (sccm) | Trim | Gas |
|---|---|---|---|---|---|---|---|---|
| #11 | Ti | 552 | 12.9 | 350 | 11 | 0 | 29.7 | $O_2$ |
| #12 | Ti | 549 | 40.8 | 350 | 11 | 0 | 29.8 | $O_2$ |
| #13 | Ti | 534 | 0.6 | 350 | 11 | 0 | 29.8 | $O_2$ |
| #14 | Ti | 263 | 39.2 | 350 | 11 | 0 | 29.8 | $O_2$ |
| #15 | Ti | 25 | 0 | 350 | 0 | 0 | 0 | |
| #23 | Si* | 658 | 71.7 | 250 | 0 | 299 | 124 | $N_2$ |
| #25 | NiCr | 507 | 18 | 250 | 193 | 0 | 0 | |
| #31 | Ag | n/a | n/a | 250 | 0 | 0 | 0 | |
| #32 | Ag | n/a | n/a | 225 | 30 | 0 | 0 | |
| #33 | NiCr | 479 | 13.5 | 250 | 72 | 0 | 0 | |
| #35 | Sn | 10.3 | 0 | 225 | 72 | 0 | 0 | |
| #41 | Sn | 479.5 | 33.8 | 200 | 389 | 75 | 159 | $O_2$ |
| #42 | Sn | 480 | 33.2 | 200 | 360 | 75 | 166 | $O_2$ |
| #43 | Sn | 494 | 30.5 | 200 | 360 | 75 | 166 | $O_2$ |
| #44 | Sn | 472 | 33.9 | 200 | 360 | 75 | 166 | $O_2$ |
| #45 | Sn | 477 | 31.1 | 200 | 360 | 75 | 166 | $O_2$ |
| #51 | Sn | 243 | 40.6 | 200 | 389 | 75 | 166 | $O_2$ |
| #52 | Sn | 2.1 | 0 | 200 | 0 | 75 | 0 | |
| #54 | Si* | 651 | 56 | 250 | 0 | 280 | 124 | $N_2$ |
| #61 | NiCr | 507 | 18 | 250 | 128 | 0 | 0 | |
| #62 | Ag | n/a | n/a | 275 | 0 | 0 | 0 | |
| #63 | Ag | 473 | 8 | 300 | 0 | 0 | 0 | |
| #64 | NiCr | 499 | 13.4 | 250 | 59 | 0 | 0 | |
| #71 | Sn | 505.6 | 42 | 200 | 555 | 62 | 195 | $O_2$ |
| #73 | Si* | 488 | 61 | 250 | 0 | 500 | 220 | $N_2$ |
| #74 | Si* | 498 | 61 | 250 | 0 | 500 | 220 | $N_2$ |
| #75 | Si* | 497 | 61 | 250 | 0 | 500 | 220 | $N_2$ |

In view of the coater set-up set forth above, it can be seen that the lower IR reflecting layer 9 was sputtered in an atmosphere including oxygen, but that the upper IR reflecting layer 19 (see cathode #s 62-63) was sputtered in a purely Ar atmosphere. Thus, lower IR reflecting layer 9 (see cathode #s 31-32) was of or included $AgO_x$ while the upper IR reflecting layer 19 was metallic Ag. In other example inclusive target for sputtering the IR reflecting layer, to (b) oxygen gas introduced into the atmosphere proximate a target for sputtering an adjacent contact layer, is from about 1:1.3 to 1:10, more preferably from about 1:1.5 to 1:8, and most preferably from about 1:2 to 1:5. In different embodiments of this invention, from about 10-250 sccm of oxygen gas may be introduced into the atmosphere proximate the Ag inclusive target, more preferably from about 20-100 sccm, and most preferably from about 20-60 sccm (e.g., regardless of the relative oxygen flow in neighboring cathode bays or the oxidation levels of the adjacent layers in the stack). Additionally, the oxygen for the contact layer(s) and/or the adjacent IR reflecting layer may be supplied in total or in part from adjacent bays. In this manner, we would rely on diffusion in the coater to supply oxygen to the contact layer(s) and/or the IR reflecting layer(s).

After being made, the coated article of the aforesaid Example was heat treated (HT) in order to temper the same. Surprisingly, it was found that high visible transmission (at least about 65%, more preferably at least about 70%, and most preferably at least about 75%) was able to be maintained for longer periods of HT when the oxygen was provided in the Ag target atmosphere for at least one of the Ag inclusive layers. The tempered coated article may then be used either monolithically, or in combination with another substrate, in various window applications.

Certain terms are prevalently used in the glass coating art, particularly when defining the properties and solar management characteristics of coated glass. Such terms are used herein in accordance with their well known meaning. For example, see the meanings of these terms as set forth in Ser. No. 09/794,224 (now U.S. Pat. No. 6,576,349), incorporated herein by reference (see also WO 02/04375).

Once given the above disclosure many other features, modifications and improvements will become apparent to the skilled artisan. For example, and without limitation, the use of oxygen in sputtering an Ag inclusive layer may be used with or without oxidation graded contact layer(s) and/or Si-rich silicon nitride layer(s), and may be used with single silver layer stacks, as well as the illustrated dual (or more) silver layer stacks. Furthermore, the dielectric materials listed above for the dielectric layers are provided for purposes of example and the instant invention is not so limited unless such materials are recited in the claims. Moreover, the term "sputtering" as used herein includes any and all forms of sputtering including but not limited to magnetron sputtering, ion-assisted sputtering, etc. Such other features, modifications and improvements are therefore considered to be a part of this invention, the scope of which is to be determined by the following claims:

What is claimed is:

1. A method of making a coated article including a coating supported by a glass substrate, the method comprising:
    sputtering a first dielectric layer on the glass substrate;
    sputtering a first contact layer over at least the first dielectric layer;
    sputtering a target comprising Ag in an atmosphere including at least oxygen gas in order to form an infrared (IR) reflecting layer comprising $AgO_x$ which is located over and contacts the first contact layer;
    sputtering a second contact layer over and contacting the IR reflecting layer comprising $AgO_x$;
    wherein said sputtering of at least one of the first and second contact layers comprises sputtering at least one target comprising a metal or metal alloy in an atmosphere including at least oxygen gas in order to form the contact layer(s) so as to comprise a metal oxide, and wherein more oxygen gas is introduced into said atmosphere in which the target for sputtering the contact layer(s) is located than is introduced into an atmosphere in which the target comprising Ag used in sputtering the IR reflecting layer is located; and
    wherein a ratio of (a) oxygen gas introduced into said atmosphere in which the target comprising Ag used in sputtering the IR reflecting layer is located, to (b) oxygen gas introduced into the atmosphere in which the target for sputtering the contact layer(s) is located, is from about 1:1.3 to 1:10.

2. The method of claim 1, wherein the at least one of the first and second contact layers comprising the metal oxide comprises an oxide of NiCr.

3. The method of claim 2, wherein each of said first and second contact layers comprises an oxide of NiCr.

4. The method of claim 1, wherein the ratio is from about 1:1.5 to 1:8.

5. The method of claim 1, wherein the ratio is from about 1:2 to 1:5.

6. The method of claim 1, wherein from about 20-100 sccm of oxygen gas is introduced into the atmosphere in which the target comprising Ag is located.

7. The method of claim 6, wherein at least one of the contact layers comprises an oxide of Ni and/or Cr.

8. The method of claim 1, wherein from about 20-60 sccm of oxygen gas is introduced into the atmosphere in which the target comprising Ag is located.

9. The method of claim 1, wherein both the oxygen gas and argon gas are introduced into the atmosphere in which the target comprising Ag is located, and wherein more argon gas than oxygen gas is introduced into the atmosphere in which the target comprising Ag is located.

10. The method of claim 1, wherein at least one of the contact layers comprises $NiCrO_x$ and is oxidation graded so that a first portion of said one contact layer close to said infrared (IR) reflecting layer is less oxidized than a second portion of said one contact layer that is further from said infrared (IR) reflecting layer.

11. The method of claim 1, further comprising heat treating the glass substrate with the coating thereon in order to thermally temper the same, and wherein visible transmission of the coated article increases as a result of said heat treating.

12. The method of claim 1, wherein the first dielectric layer comprises silicon nitride.

13. The method of claim 1, further comprising sputtering a layer comprising tin oxide over the second contact layer.

14. The method of claim 1, further comprising sputtering a layer comprising silicon nitride over the second contact layer, and then sputtering a second JR reflecting layer comprising silver over the layer comprising silicon nitride.

15. The method of claim 14, further comprising sputtering another layer comprising silicon nitride over the, second IR reflecting layer comprising silver.

16. The method of claim 15, wherein a layer comprising tin oxide is located over the second IR reflecting layer so as to be provided between the second IR reflecting layer and the another layer comprising silicon nitride.

17. A method of making a coated article including a coating supported by a glass substrate, the method comprising:
    sputtering a first dielectric layer on the glass substrate;
    sputtering a first contact layer over at least the first dielectric layer;
    sputtering a target comprising Ag in an atmosphere including at least oxygen gas in order to form an infrared (IR) reflecting layer comprising $AgO_x$ which is located over and contacts the first contact layer;
    sputtering a second contact layer over and contacting the IR reflecting layer comprising $AgO_x$;
    wherein said sputtering of at least one of the first and second contact layers comprises sputtering at least one target comprising a metal or metal alloy in an atmosphere including at least oxygen gas in order to form the contact layer(s) so as to comprise a metal oxide, and wherein more oxygen gas is introduced into said atmosphere in which the target for sputtering the contact layer(s) is located than is introduced into an atmosphere in which the target comprising Ag used in sputtering the IR reflecting layer is located.

18. The method of claim 17, wherein the at least one of the first and second contact layers comprising the metal oxide comprises an oxide of NiCr.

19. The method of claim 17, wherein each of said first and second contact layers comprises an oxide of NiCr.

20. The method of claim 17, wherein from about 20-60 sccm of oxygen gas is introduced into the atmosphere in which the target comprising Ag is located.

21. The method of claim 17, wherein both the oxygen gas and argon gas are introduced into the atmosphere in which the target comprising Ag is located, and wherein more argon gas than oxygen gas is introduced into the atmosphere in which the target comprising Ag is located.

22. The method of claim 17, wherein at least one of the contact layers comprises $NiCrO_x$ and is oxidation graded so that a first portion of said one contact layer close to said infrared (IR) reflecting layer is less oxidized than a second portion of said one contact layer that is further from said infrared (IR) reflecting layer.

23. The method of claim 17, wherein the first dielectric layer comprises silicon nitride.

24. The method of claim 17, further comprising sputtering a layer comprising tin oxide over the second contact layer.

25. The method of claim 17, further comprising sputtering a layer comprising silicon nitride over the second contact layer, and then sputtering a second IR reflecting layer comprising silver over the layer comprising silicon nitride.

26. The method of claim 25, further comprising sputtering another layer comprising silicon nitride over the second IR reflecting layer comprising silver.

27. The method of claim 26, wherein a layer comprising tin oxide is located over the second IR reflecting layer so as to be provided between the second IR reflecting layer and the another layer comprising silicon nitride.

* * * * *